United States Patent
Okihara (10) Patent No.: US 7,985,638 B2
(45) Date of Patent: Jul. 26, 2011

(54) METHOD OF MANUFACTURING SEMICONDUCTOR DEVICE

(75) Inventor: Masao Okihara, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/487,952

(22) Filed: Jun. 19, 2009

(65) Prior Publication Data

US 2009/0317950 A1 Dec. 24, 2009

(30) Foreign Application Priority Data

Jun. 24, 2008 (JP) ................................. 2008-164734

(51) Int. Cl.
*H01L 21/336* (2006.01)

(52) U.S. Cl. ........ 438/197; 438/230; 438/301; 438/311; 257/E21.177; 257/E21.435

(58) Field of Classification Search .................. 438/229, 438/581, 583, 651; 257/E21.051, E21.177, 257/E21.37, E21.4, E21.435, E21.457

See application file for complete search history.

(56) References Cited

U.S. PATENT DOCUMENTS

| 2002/0066935 A1 * | 6/2002 | Shimizu et al. ............... 257/412 |
| 2007/0197009 A1 * | 8/2007 | Srivastava et al. ............ 438/583 |

FOREIGN PATENT DOCUMENTS

| JP | 05-291576 | 11/1993 |
| JP | 2005-223073 | 8/2005 |

* cited by examiner

*Primary Examiner* — Cheung Lee
(74) *Attorney, Agent, or Firm* — Volentine & Whitt, P.L.L.C.

(57) ABSTRACT

A semiconductor device manufacturing method which sequentially forms a gate oxide film and gate electrode material over a semiconductor layer of an SOI substrate and patterns the material into gate electrodes. The method further comprises the steps of forming sidewalls made of an insulator to cover side surfaces of the gate electrode; ion-implanting into the semiconductor layer on both sides of the gate electrode to form drain/source regions; partially etching the sidewalls to expose upper parts of the side surfaces of the gate electrode; depositing a metal film to cover the tops of the drain/source regions and of the gate electrode and the exposed upper parts of the side surfaces of the gate electrode; and performing heat treatment on the SOI substrate to form silicide layers respectively in the surfaces of the gate electrode and of the drain/source regions.

3 Claims, 7 Drawing Sheets

METHOD OF MANUFACTURING SEMICONDUCTOR DEVICE

CROSS-REFERENCE TO RELATED APPLICATION

A claim of priority is made to Japanese Patent Application No. 2008-164734, filed Jun. 24, 2008, which is herein incorporated by reference.

BACKGROUND OF THE INVENTION

1. Field of the Invention

The present invention relates to a semiconductor device and particularly to a semiconductor device manufacturing method including a process of forming a silicide layer on gate electrodes and drain/source regions of semiconductor devices using an SOI (Silicon on Insulator) substrate.

2. Description of the Related Art

There is an increasing demand for LSIs with low power consumption and high performance for product applications related to personal mobile communications. However, usual CMOS devices using a silicon substrate are increasing in power consumption due to becoming more highly integrated and higher in speed with circuit elements becoming finer in size, and hence it is desired that new low power devices with a new device structure be developed. In this situation, SOI devices using an SOI (Silicon On Insulator) substrate having an insulating film between a silicon substrate and a device area are expected to serve as low power consumption, high performance devices.

The SOI devices have a structure where a semiconductor substrate layer and a semiconductor layer (an SOI layer) formed over it are separated and insulated by a buried oxide film (BOX layer). By this means, insulating separation between adjacent elements can be easily achieved, and further because a parasitic thyristor is not formed via the semiconductor substrate layer, a latch-up phenomenon is prevented from occurring. Yet further, constructing transistors in the SOI layer is effective in suppressing the so-called short-channel effect that as transistors become finer, power consumption increases. Still further, because their junction capacitance is smaller than that of transistors of a bulk structure, transistors formed of the SOI structure can operate at higher speed. Since having many excellent characteristics as such, transistors of the SOI structure are expected to be able to achieve higher speed and lower power consumption as compared with conventional semiconductor elements formed in a bulk substrate.

The SOI devices are classified into partially depleted SOI (PD-SOI) and fully depleted SOI (FD-SOI) according to the thickness of the semiconductor layer (SOI layer). For the PD-SOI, a usual CMOS process for the bulk substrate can be used as it is, and thus the PD-SOI can be fabricated at lower cost than the FD-SOI. However, because the SOI layer of the PD-SOI is thick, so-called impact ionization causes holes to accumulate underneath channels. Thus, a kink effect occurs in current-voltage characteristics, which causes problems. In contrast, for the FD-SOI, the SOI layer is thin enough that this phenomenon does not occur. Further, because threshold voltages (Vt) can be set low without an increase in off leak current as compared with the PD-SOI, the FD-SOI has the advantage of being capable of operating at low voltages as well.

As such, the FD-SOI has many advantages, but the thickness of the SOI layer is usually as thin as 50 nm or less, hence causing an increase in parasitic resistance. In order to make transistors operate at high speed, it is important to reduce parasitic resistance. The salicide process that forms silicide layers of, e.g., cobalt silicide ($CoSi_2$) or the like simultaneously, respectively on gate electrodes and drain/source regions is effective as a method to reduce the parasitic resistance of transistors.

An example of the conventional salicide process is shown below. First, a cobalt (Co) film of about 50 to 100 Å thickness is deposited by a sputter method entirely over an SOI substrate having gate electrodes and drain/source regions formed. Then, an RTA (Rapid Thermal Anneal) process at about 550° C. is performed. By this heat treatment, cobalt (Co) and silicon (Si) react, so that a cobalt monosilicide (CoSi) layer is formed in the surfaces of gate electrodes and of drain/source regions. Then, by cleaning with a sulfuric acid hydrogen peroxide mixture, an ammonia hydrogen peroxide mixture, or the like, unreacted cobalt (Co) deposited on the SOI substrate is removed. Thereafter, by further performing the RTA process at about 650° C. to 850° C., silicide layers of $CoSi_2$ are respectively formed in the surfaces of gate electrodes and of drain/source regions.

SUMMARY OF THE INVENTION

For the FD-SOI, in order to suppress the short-channel effect, the thickness of the SOI layer is required to be very thin, about 30 to 50 nm. Although silicidation reaction usually advances depth-wise into the SOI layer, because the thickness of the SOI layer of the FD-SOI is thin, the silicide layer reaches the bottom of the SOI layer, and then the silicidation reaction advances laterally. This lateral silicidation advancement causes pn junctions defining drain/source regions to be damaged, resulting in an increase in leak current.

In order to avoid this increase in leak current, the thickness of the Co film deposited on the SOI substrate may be made thinner according to the thickness of the SOI layer, thereby preventing the lateral advancement of the silicidation reaction. However, simply making the Co film thinner will also render the silicide layer formed on gate electrodes thinner, and thus the reduction in parasitic resistance will be limited, resulting in insufficient performance. As such, for FD-SOI devices, there is a trade-off relationship between the leak current and the parasitic resistance, and hence further improvement in characteristics is needed.

In order to solve this problem, Japanese Patent Application Laid-Open Publication No. 2005-223073 (Reference 1) and H05-291576 (Reference 2) both disclose a technique for making the silicide layer formed on gate electrodes thicker than the silicide layer formed on drain/source regions. However, either of them requires a large scale change to the existing salicide process, and it is not necessarily easy to implement the technique from the viewpoint of the difficulty of process and process time. That is, the addition of the process of forming an impeding film for impeding the advancement of silicidation selectively on only drain/source regions as described in Reference 1 will cause the difficulty that the thickness of the impeding film must be strictly managed, because variation in the thickness of the impeding film greatly affects the characteristics of transistors. Also, mask alignment accuracy is required when removing selectively part of the impeding film on gate electrodes. In addition, if, as described in Reference 2, the silicide layer on gate electrodes and the silicide layer on drain/source regions are formed in separate processes, process time will greatly increase.

The present invention was made in view of the above facts, and an object thereof is to provide a semiconductor device manufacturing method which, in the case transistors are formed by using a substrate of which the semiconductor layer is thin as in the FD-SOI, can realize a reduction in the parasitic resistance of the transistors by adopting silicide layer in active regions of transistors, while avoiding an increase in leak current by a relatively simple process.

According to the present invention, there is provided a semiconductor device manufacturing method which forms a MOSFET in an SOI substrate having an insulating layer between a semiconductor substrate layer and a semiconductor layer. The method comprises the steps of forming a gate oxide film over the semiconductor layer; forming a gate electrode on the gate oxide film; forming sidewalls made of an insulator to cover side surfaces of the gate electrode; ion-implanting into the semiconductor layer on both sides of the gate electrode to form drain/source regions in the semiconductor layer; partially etching the sidewalls to expose upper parts of the side surfaces of the gate electrode; depositing a metal film to cover the tops of the drain/source regions and of the gate electrode and the exposed upper parts of the side surfaces of the gate electrode; and performing heat treatment on the SOI substrate to form silicide layers respectively in the surfaces of the gate electrode and of the drain/source regions.

According to the semiconductor device manufacturing method of the present invention, the upper parts of the side surfaces of the gate electrode are exposed by the etch-back process of the sidewalls of the gate electrode, and the metal film is formed on the exposed parts as well. Hence, while the silicidation reaction is limited in the drain/source regions by the control of the thickness of the metal film, in the gate electrode, the silicidation reaction advances from the sides as well, and thus the silicidation reaction can be promoted even with the thickness of the deposited metal film being thin. By this means, the silicide layer formed on the gate electrode can be made sufficiently thicker than the silicide layer formed on the drain/source regions, and hence, when forming transistors using a substrate of which the semiconductor layer is extremely thin as in the FD-SOI, a reduction in the parasitic resistance can be realized with avoiding an increase in leak current by suppressing the excess silicidation reaction in the semiconductor layer.

Further, according to the manufacturing method of the present invention, by only adding the etch-back process of the sidewalls to expose the upper parts of the side surfaces of the gate electrode to the existing salicide process, the above effect can be obtained. Thus, process time does not greatly increase, and the process itself is easy to implement, and stable quality can be secured.

DETAILED DESCRIPTION OF THE INVENTION

Embodiments of the present invention will be described below with reference to the accompanying drawings. The same reference numerals are used to denote substantially the same or like constituents or parts throughout the figures cited below. In the description below, description will be made taking as an example the case of forming N channel MOSFETs as semiconductor devices, but the same applies to P channel MOSFETs.

First Embodiment

FIGS. 1A to 1D and FIGS. 2E to 2H are cross-sectional diagrams for the process steps respectively of an SOI-MOSFET manufacture process according to a first embodiment of the present invention.

Figure 1A:
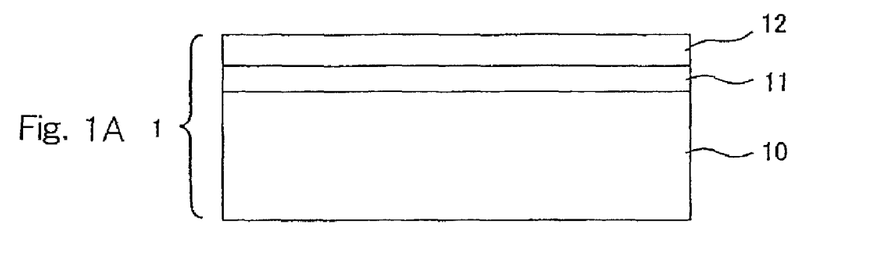
FIGS. 1A to 1D are cross-sectional structure diagrams of an SOI-MOSFET respectively showing process steps of an SOI-MOSFET manufacturing method according to a first embodiment of the present invention.

First, an SOI substrate 1 constituted by a silicon substrate 10, a BOX layer 11, and a semiconductor layer (SOI layer) 12 laid one over another is prepared. The SOI substrate 1 may be made by any method such as a UNIBOND method (registered trademark), a sticking method, a SIMOX (Silicon Implanted Oxide) method, or the like. In the UNIBOND method, after an oxide film is formed over a surface of a wafer, a high concentration of hydrogen ions are implanted, and another wafer having been stuck to the wafer, the implanted wafer is split (SmartCut) along the hydrogen-ion implanted layer by a thermal process, thereby forming the SOI substrate. In the SIMOX method, a high concentration (e.g., $1E18\ cm^{-2}$) of oxygen $O_2$ with high energy (e.g., 180 KeV) is ion-implanted into a prime wafer surface, and then implanted oxygen is made to react with silicon by heat treatment to form the BOX layer 11 of a $SiO_2$ film inside, near the wafer surface, thereby forming the SOI substrate. In contrast, in the sticking method, a wafer having a $SiO_2$ film formed on its surface and another wafer are stuck together by heat and pressure, and by grinding silicon on one side down to some depth, the SOI substrate 1 is formed. For the FD-SOI, the semiconductor layer (SOI layer) 12 is made thinner to be, e.g., about 50 nm thick by grinding or etching (FIG. 1A).

Figure 1B:
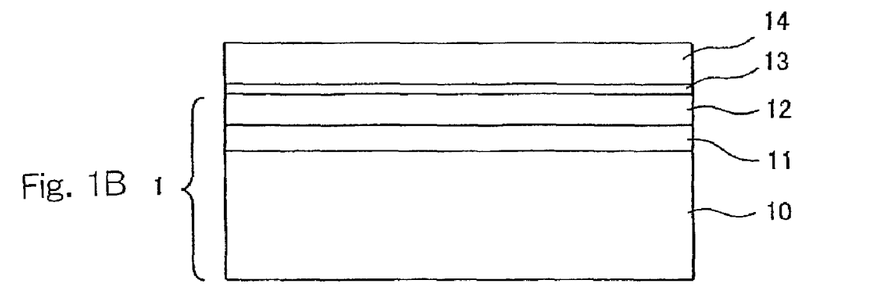

Then, a $SiO_2$ film 13 of about 100 Å thickness constituting a gate oxide film is formed over the semiconductor layer (SOI layer) 12 by a thermal oxidation process. Subsequently, a poly-silicon film 14 of about 3,000 Å thickness constituting gate electrodes is formed over the $SiO_2$ film 13 by an LP-CVD method or the like (FIG. 1B).

Figure 1C:
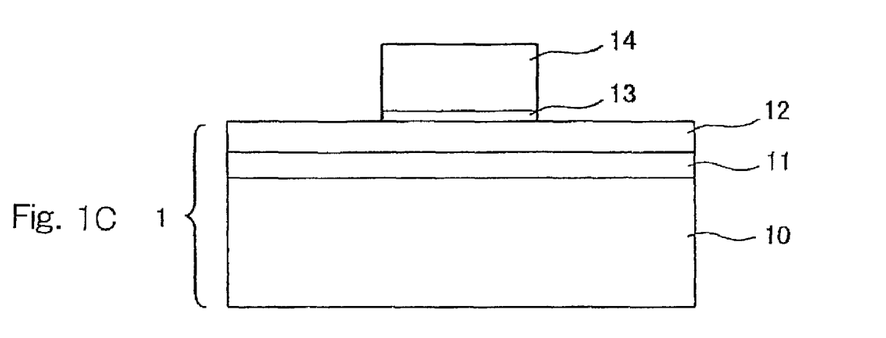

Next, a photo-resist is coated over the formed poly-silicon film 14, and a photo-mask (not shown) is formed through exposure and development. Parts of the poly-silicon film 14 and of the $SiO_2$ film 13 under the resist openings are removed by anisotropic dry etching, thereby patterning the poly-silicon film into gate electrodes 14 (FIG. 1C).

Figure 1D:
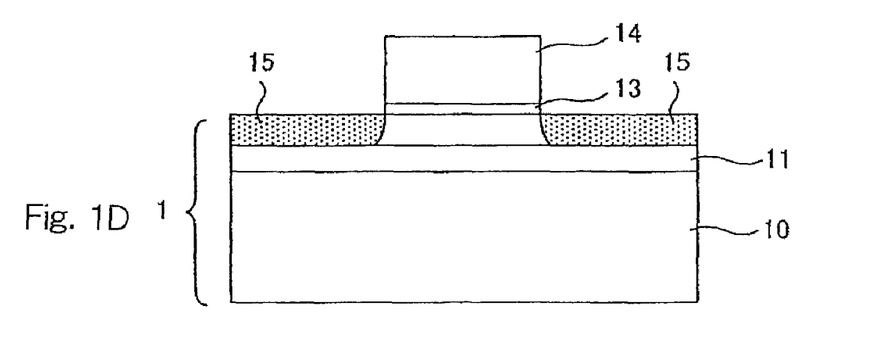

Then, with the patterned gate electrodes 14 as a mask, for example, phosphorus (P) is ion-implanted at a dose amount of about 1E12 $cm^{-2}$, thereby forming n-type extension regions 15 of a relatively low concentration self-aligned with the gate electrode 14. The extension regions 15 are located between drain/source regions 17 formed in a later process and a channel region to decrease an electric field near the drain edge, thus working to improve the breakdown voltage (FIG. 1D).

Figure 2E:
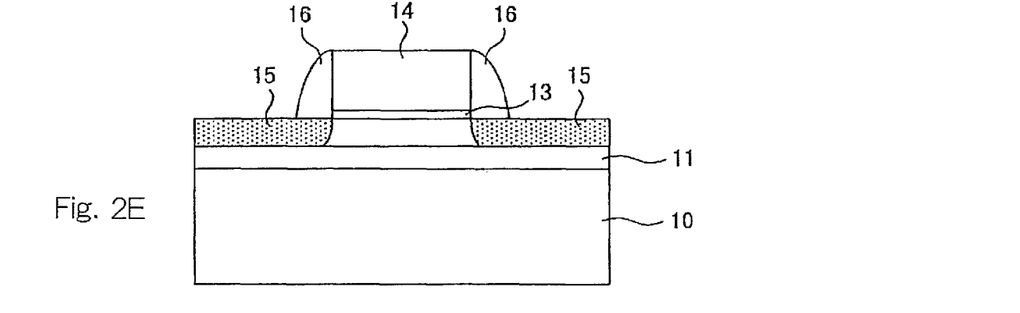
FIGS. 2E to 2H are cross-sectional structure diagrams of the SOI-MOSFET respectively showing process steps subsequent to FIG. 1D of the SOI-MOSFET manufacturing method according to the first embodiment of the present invention.

Next, a $SiO_2$ film is deposited with isotropic step coverage on the SOI substrate 1 by a CVD method. Thereafter, this $SiO_2$ film is etched back by reactive ion etching (RIE) to form sidewalls 16 at the sides of the gate electrode 14 (FIG. 2E).

Figure 2F:
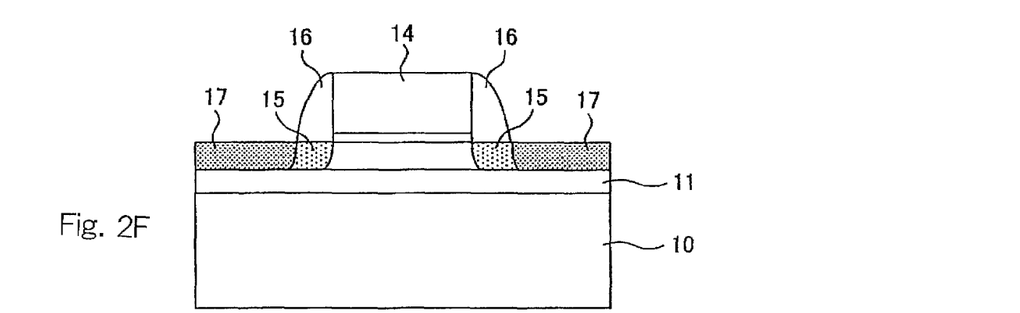

Then, with the gate electrode 14 having the sidewalls 16 formed at the sides as a mask, for example, phosphorus (P) is ion-implanted at a dose amount of about 1E15 $cm^{-2}$, thereby forming n-type drain/source regions 17 of a relatively high concentration self-aligned with the gate electrode. In this ion-implantation, because the sidewalls 16 as well as the gate electrode 14 work as a mask, the drain/source regions 17 are formed further back than the extension regions 15, and thus the extension regions 15 are located at the ends of the drain/source regions 17 (FIG. 2F).

Figure 2G:
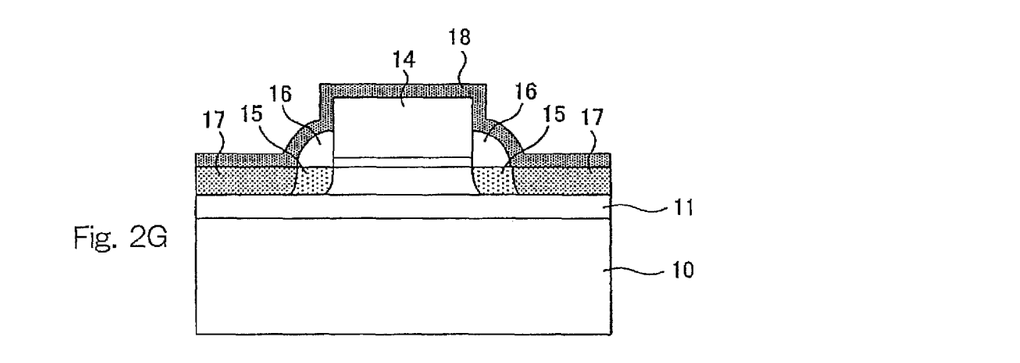

Next, the sidewalls 16 are etched back by about 1,000 Å from the top of the gate electrode 14 by wet etching, dry etching, or the like. That is, by this etch-back, the upper parts of the side surfaces of the gate electrode 14 are exposed. Then, cobalt (Co) is deposited entirely over the SOI substrate 1 by the sputter method to form a Co film 18 of about several tens nm thickness with conformal, i.e., isotropic step coverage. Here, collimated sputtering or the like that is performed to increase the vertical incident component of adhering atoms is not suitable, and it is desirable to perform sputtering such that dispersed Co atoms come to adhere at various angles. By this means, the Co film 18 of enough thickness can be formed uniformly on the upper parts of the side surfaces of the gate electrode 14 exposed by the preceding etching process as well as the tops of the drain/source regions 17 and of the gate electrode 14. Not being limited to cobalt (Co), another metal such as titanium (Ti) or tungsten (W) can be used as material for the film (FIG. 2G).

Figure 2H:
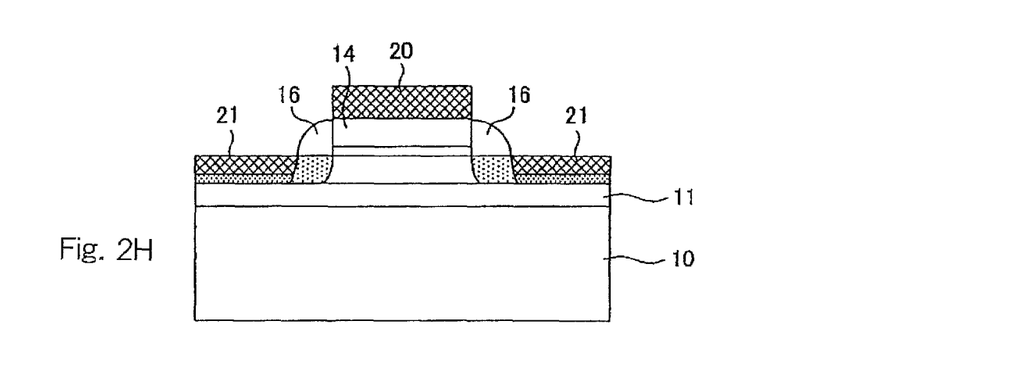

Then, the RTA process is performed at an ambient temperature of about 550° C. By this heat treatment, the Co film 18 and the silicon react in the drain/source regions 17 to form a cobalt monosilicide (CoSi) layer in the surface thereof. The silicidation reaction advances likewise in the gate electrode 14. The silicidation reaction advances not only from the top of the gate electrode but also from the sides thereof exposed by the preceding etch-back process for the sidewalls. Then, by cleaning with a sulfuric acid hydrogen peroxide mixture, an ammonia hydrogen peroxide mixture, or the like, unreacted Co film parts deposited on the SOI substrate 1 are removed. Subsequently, by further performing the RTA process at about 650° C. to 850° C., cobalt silicide ($CoSi_2$) layers 20, 21 are respectively formed in the surfaces of gate electrodes and of drain/source regions. For the gate electrode 14, because the silicidation reaction also advances from the sides exposed as mentioned above, even where the Co film of the same thickness is formed and the same heat treatment is performed, the silicide layer 20 formed on the gate electrode 14 can be made thicker than the silicide layer 21 formed on the drain/source regions 17 (FIG. 2H).

Then, an interlayer insulating film (not shown) is formed entirely over the SOI substrate 1, and contact holes for electrode lead-out from the gate, drain, and source are formed in the interlayer insulating film by photolithography and dry etching. Thereafter, an aluminum (Al) film (not shown) for metal lines is formed over the SOI substrate 1. Then the aluminum film is patterned by photolithography and dry etching to form aluminum lines. Finally, in order to secure the ohmicness of the contacts between the aluminum lines and silicon and poly-silicon, heat treatment is performed. By undergoing the above processes, the fundamental structure of MOSFET is finished.

As described above, according to the semiconductor device manufacturing method of the present invention, the upper parts of the side surfaces of the gate electrode are exposed by the etch-back process for the sidewalls of the gate electrode, and the Co film is formed on the exposed parts as well. Hence, while the silicidation reaction is limited in the drain/source regions by the control of the thickness of the Co film, in the gate electrode, the silicidation reaction advances from the sides as well, and thus the silicidation reaction can be promoted even with the thickness of the deposited Co film being thin. By this means, the silicide layer formed on the gate electrode can be made sufficiently thicker than the silicide layer formed on the drain/source regions. Hence, when forming transistors using a substrate of which the semiconductor layer (SOI layer) is extremely thin as in the FD-SOI, a reduction in the parasitic resistance can be realized with avoiding an increase in leak current by suppressing the excess silicidation reaction in the semiconductor layer (SOI layer).

Further, according to the manufacturing method of the present invention, by only adding the etch-back process of the sidewalls to expose the upper parts of the side surfaces of the gate electrode to the existing salicide process, the above effect can be obtained. That is, because there is no need to change the manufacture process to form the silicide layers of the gate electrode and the drain/source regions in separate processes, process time does not greatly increase, and the process itself is easy to implement, and stable quality can be secured.

Second Embodiment

Next, the manufacturing method of MOSFETs using the SOI substrate according to a second embodiment of the present invention will be described with reference to FIGS. 3A to 3C and FIGS. 4D to 4E. The manufacturing method of the present embodiment is the same in the process until the step of forming the poly-silicon film constituting the gate electrodes 14 over the SOI substrate 1 as in the above first embodiment, and description thereof is omitted. Thus, FIGS. 3A to 3C and FIGS. 4D to 4E show the process steps after the poly-silicon film 14 is formed.

Figure 3A:
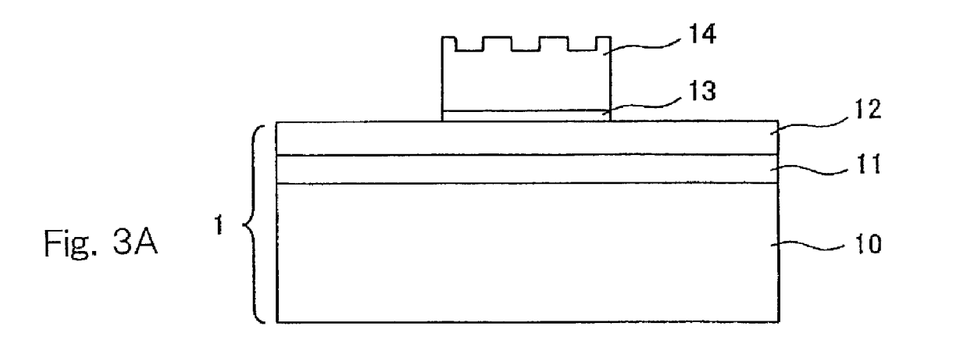
FIGS. 3A to 3C are cross-sectional structure diagrams of an SOI-MOSFET respectively showing process steps of an SOI-MOSFET manufacturing method according to a second embodiment of the present invention.

After the $SiO_2$ film 13 constituting a gate oxide film and the poly-silicon film 14 constituting gate electrodes are formed over the SOI substrate 1, a plurality of grooves, e.g., about 0.2 μm wide and about 0.1 μm deep are formed at about 0.2 μm intervals in the gate electrode 14 by photolithography and dry etching. With the plurality of grooves, the surface area of the top of the gate electrode 14 becomes about 1.5 times larger. Then, the gate electrodes 14 are patterned into by photolithography and dry etching (FIG. 3A).

Figure 3B:
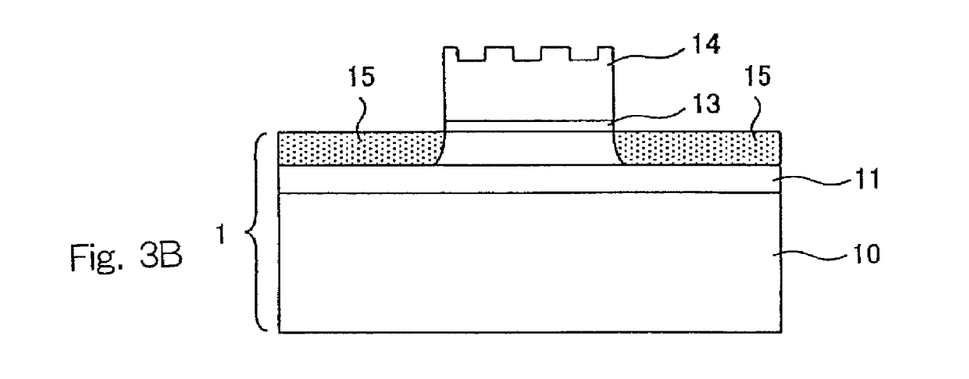

Then, with the patterned gate electrodes 14 as a mask, for example, phosphorus (P) is ion-implanted at a dose amount of about 1E12 $cm^{-2}$, thereby forming n-type extension regions 15 of a relatively low concentration self-aligned with the gate electrode 14 (FIG. 3B).

Figure 3C:
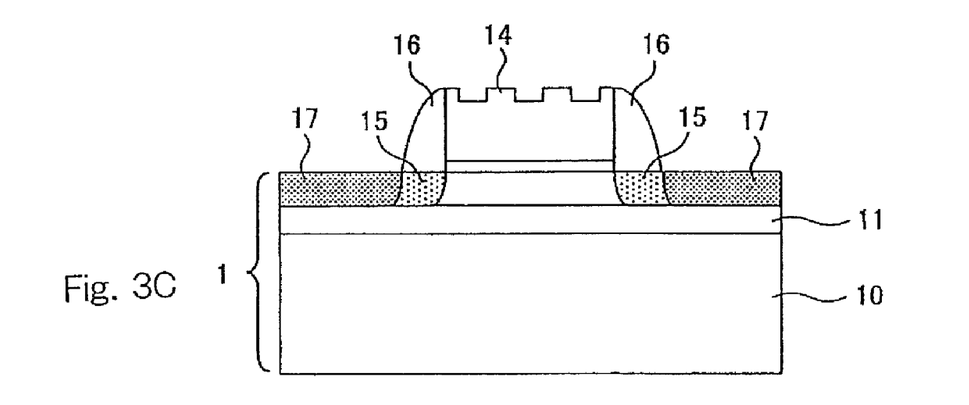

Next, a $SiO_2$ film is deposited with isotropic step coverage on the SOI substrate 1 by the CVD method. Thereafter, this $SiO_2$ film is etched back by reactive ion etching (RIE) to form sidewalls 16 at the sides of the gate electrode 14. Subsequently, with the gate electrode 14 having the sidewalls 16 formed at the sides as a mask, for example, phosphorus (P) is ion-implanted at a dose amount of about 1E15 $cm^{-2}$, thereby forming n-type drain/source regions 17 of a relatively high concentration self-aligned with the gate electrode. In this ion-implantation, because the sidewalls 16 as well as the gate electrode 14 work as a mask, the drain/source regions 17 are formed further back than the extension regions 15, and thus the extension regions 15 are located at the ends of the drain and the source (FIG. 3C).

Figure 4D:
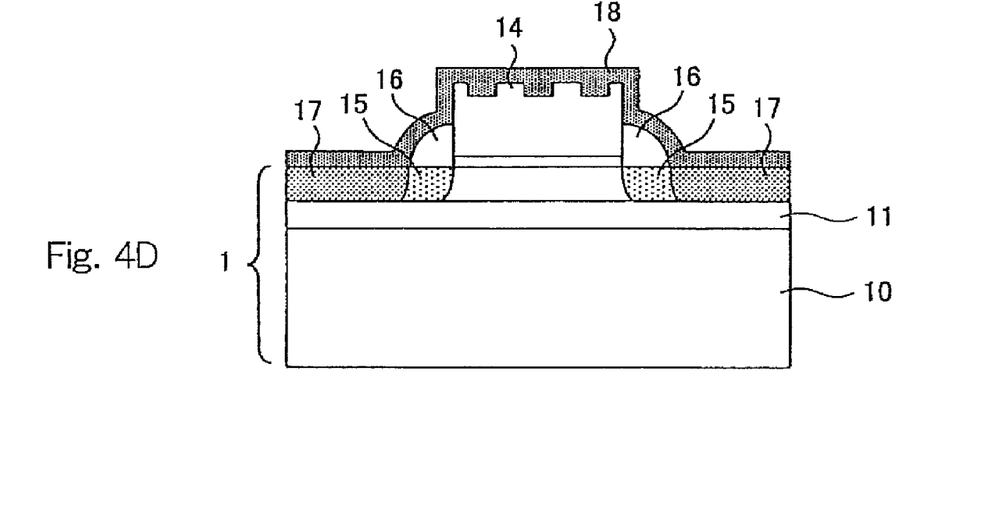
FIGS. 4D to 4E are cross-sectional structure diagrams of the SOI-MOSFET respectively showing process steps subsequent to FIG. 3C of the SOI-MOSFET manufacturing method according to the second embodiment of the present invention.

Then, the sidewalls 16 are etched back by about 1,000 Å from the top of the gate electrode 14 by wet etching, dry etching, or the like. By this etch-back, the upper parts of the side surfaces of the gate electrode 14 are exposed. At this time, it is important to perform etching such that the $SiO_2$ film does not remain inside the plurality of grooves formed in the gate electrode 14.

Then, cobalt (Co) is deposited entirely over the SOI substrate 1 by the sputter method to form a Co film 18 of about several tens nm thickness with conformal, i.e., isotropic step coverage. At this time, the Co film 18 fills the insides of the plurality of grooves formed in the gate electrode 14. Here, collimated sputtering or the like that is performed to increase the vertical incident component of adhering atoms is not suitable, and it is desirable to perform sputtering such that dispersed Co atoms come to adhere at various angles. By this means, the Co film 18 of enough thickness can be formed uniformly on the upper parts of the side surfaces of the gate electrode 14 exposed by the preceding etching process as well as the tops of the drain/source regions 17 and of the gate electrode 14. Not being limited to cobalt (Co), another metal such as titanium (Ti) or tungsten (W) can be used as material for the film. Further, the collimated sputtering may be used so that the Co film reliably fills the insides of the grooves formed in the top of the gate electrode (FIG. 4D).

Figure 4E:
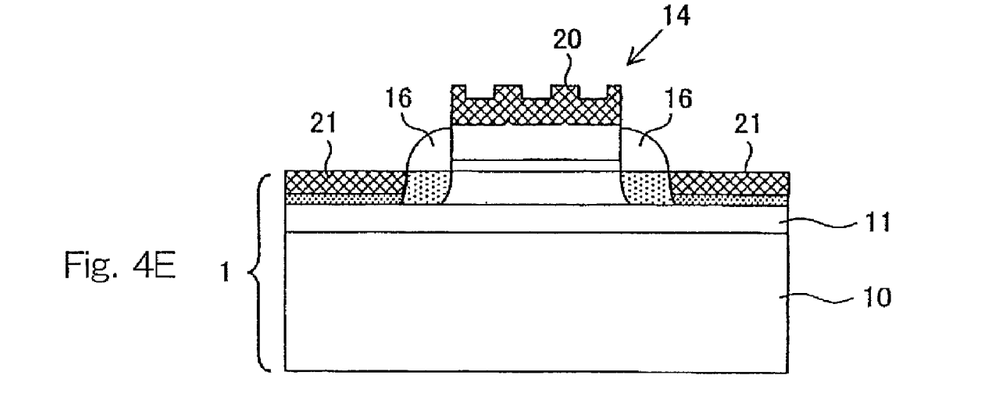

Then, the RTA process is performed at an ambient temperature of about 550° C. By this heat treatment, the Co film 18 and the silicon react in the drain/source regions 17 to form a cobalt monosilicide (CoSi) layer in the surface thereof. In the gate electrode 14, the silicidation reaction advances also from the sides thereof exposed by the preceding etch-back process for the sidewalls and from the inner surfaces of the grooves formed in the top thereof. Further, because the formation of the grooves has enlarged the surface area of the top of the gate electrode 14, the silicidation reaction is promoted to advance deeper into the gate electrode 14. Then, by cleaning with a sulfuric acid hydrogen peroxide mixture, an ammonia hydrogen peroxide mixture, or the like, unreacted Co film parts deposited on the SOI substrate 1 are removed. Subsequently, by further performing the RTA process at about 650° C. to 850° C., cobalt silicide ($CoSi_2$) layers 20, 21 are respectively formed in the surfaces of the gate electrodes 14 and of the drain/source regions 17. For the gate electrode 14, because the silicidation reaction also advances from the sides exposed and the inner surfaces of the grooves as mentioned above, even where the Co film of the same thickness is formed and the same heat treatment is performed, the silicide layer 20 formed on the gate electrode 14 can be made thicker than the silicide layer 21 formed on the drain/source regions 17 (FIG. 4E).

Then, an interlayer insulating film (not shown) is formed entirely over the SOI substrate 1, and contact holes for electrode lead-out from the gate, drain, and source are formed in the interlayer insulating film by photolithography and dry etching. Thereafter, an aluminum (Al) film (not shown) for metal lines is formed over the SOI substrate 1. Then the aluminum film is patterned by photolithography and dry etching to form aluminum lines. Finally, in order to secure the ohmicness of the contacts between the aluminum lines and silicon and poly-silicon, heat treatment is performed. By undergoing the above processes, the fundamental structure of MOSFET is finished.

As described above, according to the manufacturing method of the second embodiment, even where because the gate-lengthwise size of the gate electrode 14 is relatively large, the silicide layer 20 of enough thickness cannot be formed by only exposing the upper parts of the side surfaces of the gate electrode as in the first embodiment, the silicidation reaction advances in the gate electrode 14 from the inner surfaces of the plurality of grooves formed in the top of the gate electrode 14, and hence the silicide layer 20 of enough thickness can be formed in the gate electrode 14. Thus, when forming transistors using a substrate of which the semiconductor layer (SOI layer) is extremely thin as in the FD-SOI, a reduction in the parasitic resistance can be realized with avoiding an increase in leak current by suppressing the excess silicidation reaction in the semiconductor layer (SOI layer).

Third Embodiment

Next, the manufacturing method of MOSFETs using the SOI substrate according to a third embodiment of the present invention will be described with reference to FIGS. 5A to 5C and FIGS. 6D to 6E.

Figure 5A:
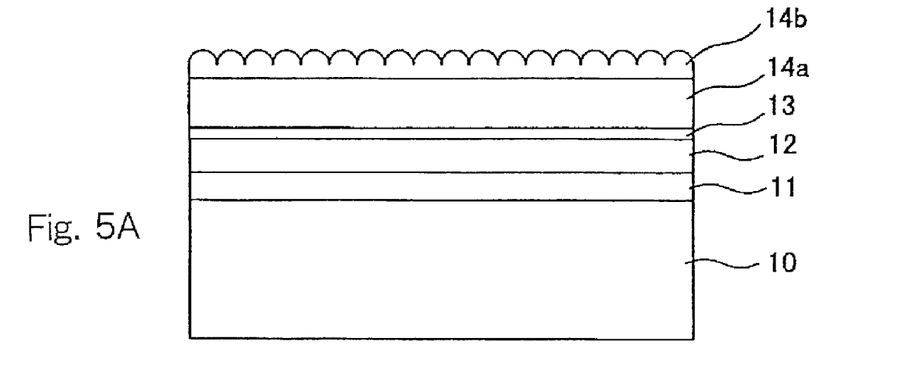
FIGS. 5A to 5C are cross-sectional structure diagrams of an SOI-MOSFET respectively showing process steps of an SOI-MOSFET manufacturing method according to a third embodiment of the present invention.

First, a $SiO_2$ film 13 of about 100 Å thickness constituting a gate oxide film is formed over the semiconductor layer (SOI layer) 12 by the thermal oxidation process. Then, a first poly-silicon film 14a constituting the lower layer of gate electrodes 14 is formed over the $SiO_2$ film 13 by the LP-CVD method or the like. The first poly-silicon film 14a is formed by a method usually performed when forming gate electrodes, for example, a reduced-pressure CVD method under process conditions of a reaction temperature of 620° C. and a pressure of 0.2 Torr using silane gas ($SiH_4$). Subsequently, a second poly-silicon film 14b having multiple bumps and hollows on its surface, i.e., having a rough surface is formed over the first poly-silicon film 14a. The second poly-silicon film 14b is constituted by, e.g., a HSG (Hemi-Spherical Grain Poly-Si) film, which can be formed by, e.g., the following method. First, an amorphous silicon film is deposited over the first poly-silicon film by the reduced-pressure CVD method under process conditions of, e.g., a reaction temperature of 570° C. and a pressure of 0.2 Torr using silane gas ($SiH_4$) as material gas. Then, heat treatment at 570° C. for about 20 minutes is performed in a vacuum. During this heat treatment, the migration of atoms happens on the amorphous silicon film, and crystal nuclei occurring at a certain probability collect silicon from around them to grow large, thus forming hemispherical bumps on the surface. As such, the outer layer of the gate electrodes is constituted by the second poly-silicon film 14b having the bump-and-hollow surface, and thereby the surface area of the top of the gate electrodes becomes about twice larger than that of the usual flat surface (FIG. 5A).

Figure 5B:
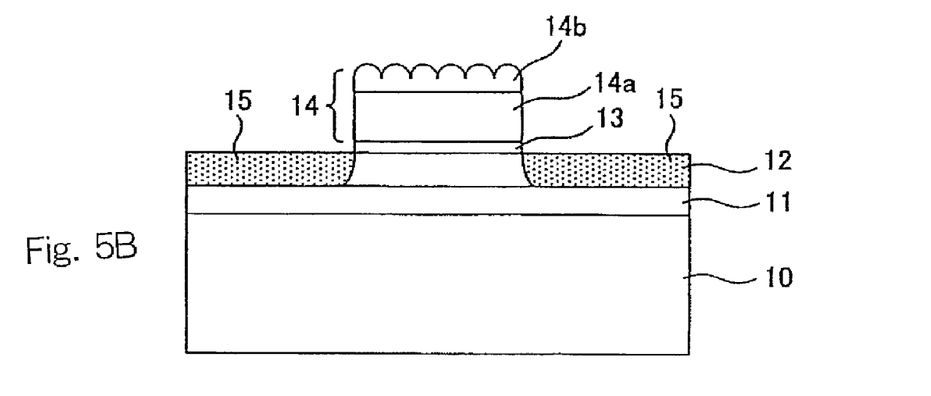

Then, the gate electrodes 14 are patterned into by photolithography and dry etching. Then, with the patterned gate electrodes 14 as a mask, for example, phosphorus (P) is ion-implanted at a dose amount of about $1E12 \text{ cm}^{-2}$, thereby forming n-type extension regions 15 of a relatively low concentration self-aligned with the gate electrode 14 (FIG. 5B).

Figure 5C:
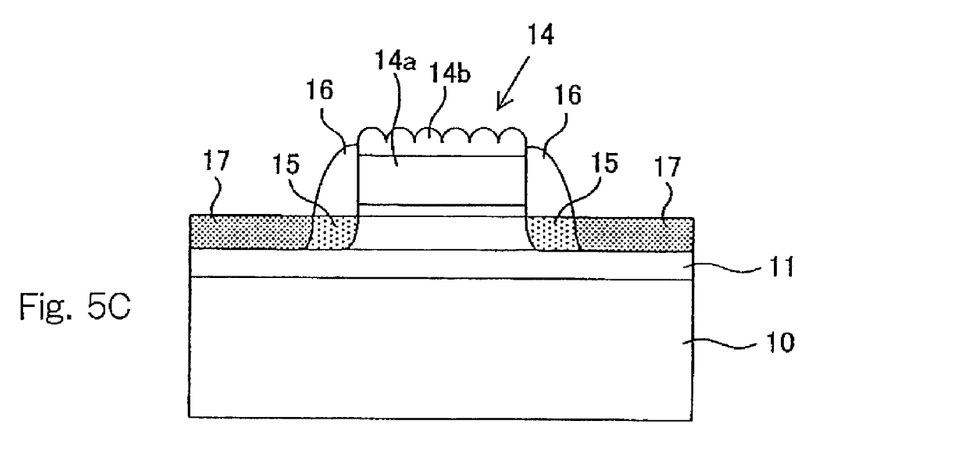

Next, a $SiO_2$ film is deposited with isotropic step coverage on the SOI substrate 1 by the CVD method. Thereafter, this $SiO_2$ film is etched back by reactive ion etching (RIE) to form sidewalls 16 at the sides of the gate electrode 14. Subsequently, with the gate electrode 14 having the sidewalls 16 formed at the sides as a mask, for example, phosphorus (P) is ion-implanted at a dose amount of about $1E15 \text{ cm}^{-2}$, thereby forming n-type drain/source regions 17 of a relatively high concentration self-aligned with the gate electrode. In this ion-implantation, because the sidewalls 16 as well as the gate electrode 14 work as a mask, the drain/source regions 17 are formed further back than the extension regions 15, and thus the extension regions 15 are located at the ends of the drain and the source (FIG. 5C).

Figure 6D:
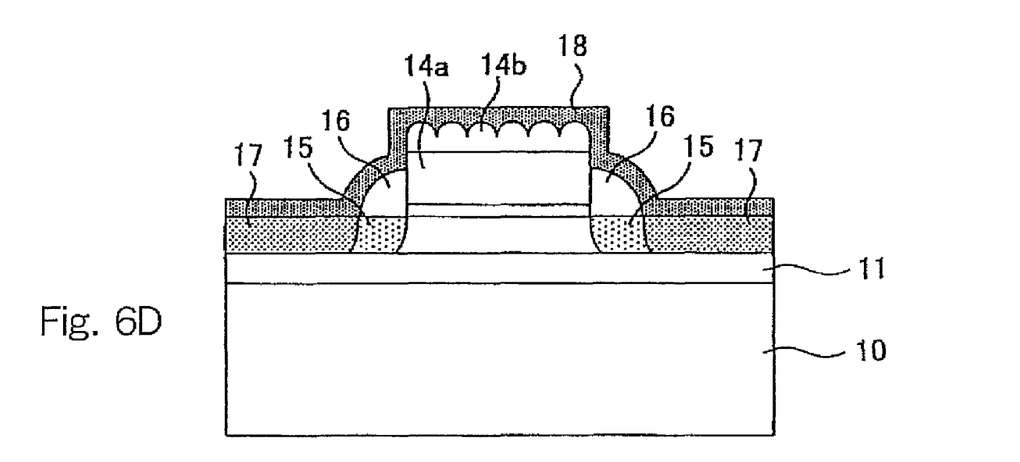
FIGS. 6D to 6E are cross-sectional structure diagrams of the SOI-MOSFET respectively showing process steps subsequent to FIG. 5C of the SOI-MOSFET manufacturing method according to the third embodiment of the present invention.

Then, the sidewalls 16 are etched back by about 1,000 Å from the top of the gate electrode 14 by wet etching, dry etching, or the like. By this etch-back, the upper parts of the side surfaces of the gate electrode 14 are exposed. Then, cobalt (Co) is deposited entirely over the SOI substrate 1 by the sputter method to form a Co film 18 of about several tens nm thickness with conformal, i.e., isotropic step coverage. Here, collimated sputtering or the like that is performed to increase the vertical incident component of adhering atoms is not suitable, and it is desirable to perform sputtering such that dispersed Co atoms come to adhere at various angles. By this means, the Co film 18 of enough thickness can be formed uniformly on the upper parts of the side surfaces of the gate electrode 14 exposed by the preceding etching process as well as the tops of the drain/source regions 17 and of the gate electrode 14 having the rough surface. Not being limited to cobalt (Co), another metal such as titanium (Ti) or tungsten (W) can be used as material for the film (FIG. 6D).

Figure 6E:
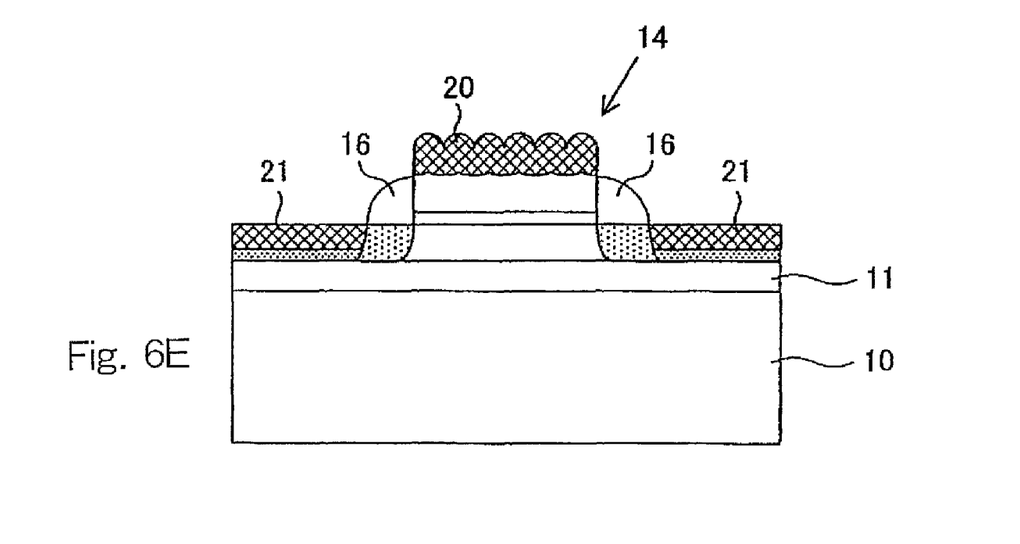

Then, the RTA process is performed at about 550° C. By this heat treatment, the Co film 18 and the silicon react in the drain/source regions 17 to form a cobalt monosilicide (CoSi) layer in the surface thereof. In the gate electrode 14, because the formation of the multiple bumps and hollows on its top has enlarged the surface area thereof, the silicidation reaction is promoted, so that the silicide layer is formed down to a deeper depth in the gate electrode. Then, by cleaning with a sulfuric acid hydrogen peroxide mixture, an ammonia hydrogen peroxide mixture, or the like, unreacted Co film parts deposited on the SOI substrate 1 are removed. Subsequently, by further performing the RTA process at about 650° C. to 850° C., cobalt silicide ($CoSi_2$) layers 20, 21 are respectively formed in the surfaces of the gate electrodes 14 and of the drain/source regions 17. For the gate electrode 14, because the top surface area is enlarged thus promoting the silicidation reaction as mentioned above, even where the Co film of the same thickness is formed and the same heat treatment is performed, the silicide layer 20 formed on the gate electrode 14 can be made thicker than the silicide layer 21 formed on the drain/source regions 17 (FIG. 6E).

Then, an interlayer insulating film (not shown) is formed entirely over the SOI substrate 1, and contact holes for electrode lead-out from the gate, drain, and source are formed in the interlayer insulating film by photolithography and dry etching. Thereafter, an aluminum (Al) film (not shown) for metal lines is formed over the SOI substrate 1. Then the aluminum film is patterned by photolithography and dry etching to form aluminum lines. Finally, in order to secure the ohmicness of the contacts between the aluminum lines and silicon and poly-silicon, heat treatment is performed. By undergoing the above processes, the fundamental structure of MOSFET is finished.

As described above, according to the manufacturing method of the third embodiment, even where because the gate-lengthwise size of the gate electrode 14 is relatively large, the silicide layer 20 of enough thickness cannot be formed by only exposing the upper parts of the side surfaces of the gate electrode as in the first embodiment, by forming the poly-silicon film such that the top of the gate electrode is a rough surface, the surface area thereof is enlarged thus promoting the silicidation reaction, and hence the silicide layer 20 of enough thickness can be formed in the gate electrode surface. Thus, when forming transistors using a substrate of which the semiconductor layer (SOI layer) is extremely thin as in the FD-SOI, a reduction in the parasitic resistance can be realized with avoiding an increase in leak current by suppressing the silicidation reaction in the semiconductor layer (SOI layer).

Modified Embodiment

A modified embodiment of the manufacturing method of MOSFETs using the SOI substrate according to the present invention will be described below with reference to FIG. 7. In the above embodiments, after the drain/source regions are formed, the sidewalls are etched back to expose the upper parts of the side surfaces of the gate electrode. In contrast, in the present embodiment, after the sidewalls are etched back, the drain/source regions are formed. The manufacturing method of the present embodiment is the same in the process until the step of forming the sidewalls 16 on the SOI substrate 1 (FIG. 2E) as in the above first embodiment, and description thereof is omitted. Thus, FIGS. 7A to 7D show the process steps after the sidewalls 16 are formed.

Figure 7A:
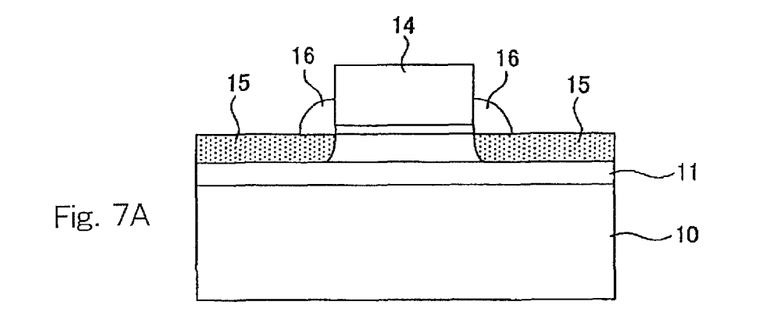
FIGS. 7A to 7D are cross-sectional structure diagrams of an SOI-MOSFET respectively showing process steps subsequent to FIG. 2E of an SOI-MOSFET manufacturing method according to a modified embodiment of the present invention.

After forming the sidewalls 16 to cover the side surfaces of the gate electrode 14, the sidewalls 16 are etched back by about 1,000 Å from the top of the gate electrode 14 by wet etching, dry etching, or the like. By this etch-back, the upper parts of the side surfaces of the gate electrode 14 are exposed (FIG. 7A).

Figure 7B:
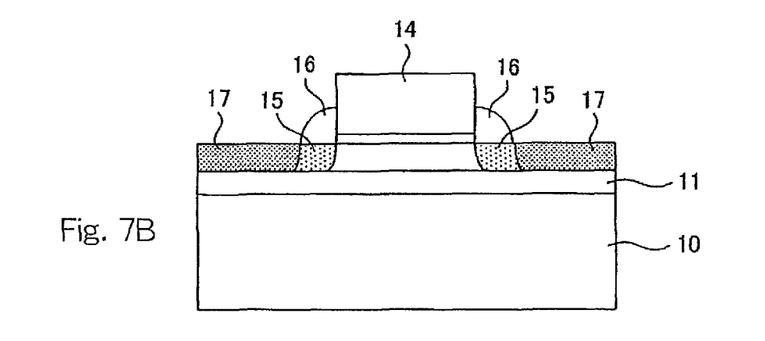

Next, with the gate electrode 14 having the sidewalls 16 formed at the sides as a mask, for example, phosphorus (P) is ion-implanted at a dose amount of about $1E15\ cm^{-2}$, thereby forming n-type drain/source regions 17 of a relatively high concentration self-aligned with the gate electrode. In this ion-implantation, because the sidewalls 16 as well as the gate electrode 14 work as a mask, the drain/source regions 17 are formed further back than the extension regions 15, and thus the extension regions 15 are located at the ends of the drain/source regions 17 (FIG. 7B). Note that because the sidewalls 16 are etched back mainly in a height direction by the preceding etch-back process and hardly in a lateral direction, after the etch-back of the sidewalls, the drain/source regions 17 can be formed with the sidewalls as a mask as in the present embodiment.

Figure 7C:
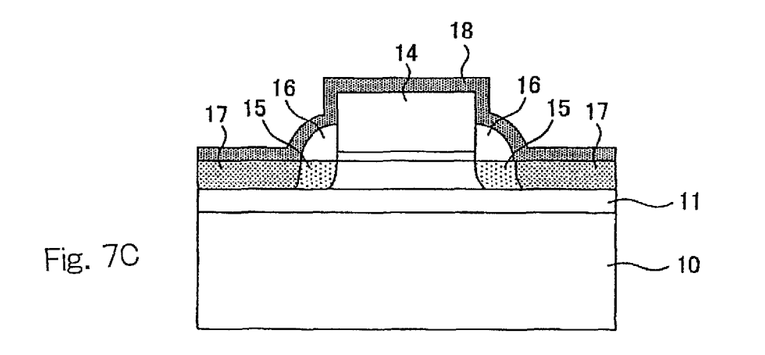

Then, cobalt (Co) is deposited entirely over the SOI substrate 1 by the sputter method to form a Co film 18 of about several tens nm thickness with conformal, i.e., isotropic step coverage. Here, collimated sputtering or the like that is performed to increase the vertical incident component of adhering atoms is not suitable, and it is desirable to perform sputtering such that dispersed Co atoms come to adhere at various angles. By this means, the Co film 18 of enough thickness can be formed evenly on the upper parts of the side surfaces of the gate electrode 14 exposed by the preceding etching process as well as the tops of the drain/source regions 17 and of the gate electrode 14. Not being limited to cobalt (Co), another metal such as titanium (Ti) or tungsten (W) can be used as material for the film (FIG. 7C).

Figure 7D:
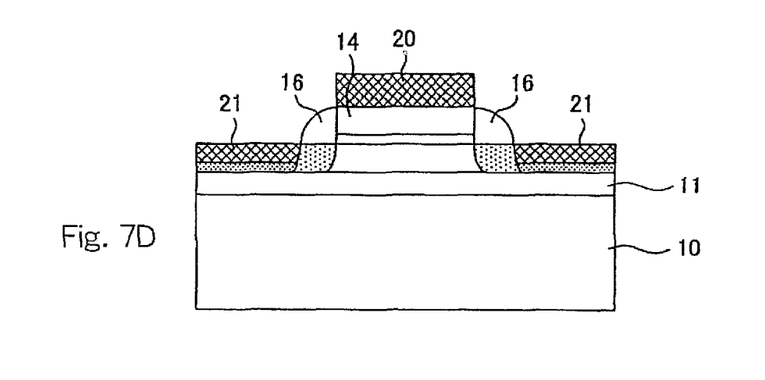

Then, the RTA process is performed at an ambient temperature of about 550° C. By this heat treatment, the Co film 18 and the silicon react in the drain/source regions 17 to form a cobalt monosilicide (CoSi) layer in the surface thereof. The silicidation reaction advances likewise in the gate electrode 14, but the silicidation reaction advances not only from the top of the gate electrode but also from the sides thereof exposed by the preceding etch-back process for the sidewalls. Then, by cleaning with a sulfuric acid hydrogen peroxide mixture, an ammonia hydrogen peroxide mixture, or the like, unreacted Co film parts deposited on the SOI substrate 1 are removed. Subsequently, by further performing the RTA process at about 650° C. to 850° C., cobalt silicide ($CoSi_2$) layers 20, 21 are respectively formed in the surfaces of the gate electrodes 14 and of the drain/source regions 17. For the gate electrode 14, because the silicidation reaction also advances from the sides exposed as mentioned above, even where the Co film of the same thickness is formed and the same heat treatment is performed, the silicide layer 20 formed on the gate electrode 14 can be made thicker than the silicide layer 21 formed on the drain/source regions 17 (FIG. 7D).

Then, an interlayer insulating film (not shown) is formed entirely over the SOI substrate 1, and contact holes for electrode lead-out from the gate, drain, and source are formed in the interlayer insulating film by photolithography and dry etching. Thereafter, an aluminum (Al) film (not shown) for metal lines is formed over the SOI substrate 1. Then the aluminum film is patterned by photolithography and dry etching to form aluminum lines. Finally, in order to secure the ohmicness of the contacts between the aluminum lines and silicon and poly-silicon, heat treatment is performed. By undergoing the above processes, the fundamental structure of MOSFET is finished.

What is claimed is:

1. A semiconductor device manufacturing method which forms a MOSFET in an SOI substrate having an insulating layer between a semiconductor substrate layer and a semiconductor layer, said method comprising the steps of:

forming a gate oxide film over said semiconductor layer;
forming a gate electrode on said gate oxide film;
forming sidewalls made of an insulator to cover side surfaces of said gate electrode;
ion-implanting into said semiconductor layer on both sides of said gate electrode to form drain/source regions in said semiconductor layer;
partially etching said sidewalls to expose upper parts of the side surfaces of said gate electrode;
depositing a metal film to cover top surfaces of said drain/source regions, a top surface of said gate electrode and the exposed upper parts of the side surfaces of said gate electrode;
performing heat treatment on said SOI substrate to form silicide layers respectively in the surfaces of said gate electrode and said drain/source regions; and
before said depositing a metal film, forming a plurality of grooves in the top surface of said gate electrode by etching said gate electrode,
wherein in said depositing a metal film, each of said plurality of grooves is filled with said metal film by sputtering.

2. A semiconductor device manufacturing method according to claim 1, wherein said metal film is deposited to have isotropic step coverage.

3. A semiconductor device manufacturing method according to claim 1, wherein said metal film is a cobalt film.

* * * * *